United States Patent [19]
Masumo et al.

[11] Patent Number: 5,808,318
[45] Date of Patent: Sep. 15, 1998

[54] POLYCRYSTALLINE SEMICONDUCTOR THIN FILM FOR SEMICONDUCTOR TFT ON A SUBSTRATE HAVING A MOBILITY IN A LONGITUDINAL DIRECTION GREATER THAN IN A WIDTH DIRECTION

[75] Inventors: Kunio Masumo; Masaya Kunigita, both of Yokohama, Japan

[73] Assignee: AG Technology Co., Ltd., Yokohama, Japan

[21] Appl. No.: 827,446

[22] Filed: Mar. 28, 1997

[30] Foreign Application Priority Data

| Mar. 3, 1996 | [JP] | Japan | 8-077072 |
| Apr. 5, 1996 | [JP] | Japan | 8-084290 |
| Apr. 8, 1996 | [JP] | Japan | 8-085472 |

[51] Int. Cl.$^6$ ................................................. H01L 21/336
[52] U.S. Cl. ................................ 257/66; 257/56; 257/62; 257/59; 257/72; 257/75; 438/149; 438/162; 438/166
[58] Field of Search .......................... 438/149, 162, 438/166; 257/56, 62, 66, 59, 72, 75

[56] References Cited

U.S. PATENT DOCUMENTS

| 5,306,651 | 4/1994 | Masumo et al. | |
| 5,534,445 | 7/1996 | Tran et al. | 438/166 |
| 5,589,406 | 12/1996 | Kato et al. | |

FOREIGN PATENT DOCUMENTS

| 404286336 | 10/1992 | Japan | 438/448 |
| 5-218430 | 8/1993 | Japan | |
| 94-097073 | 4/1994 | Japan | |
| 6-163401 | 6/1994 | Japan | |
| 404330717 | 11/1996 | Japan | 438/448 |
| WO 93010555 | 5/1993 | WIPO | 438/448 |

OTHER PUBLICATIONS

Kunio Masumo, et al. "Low–Temperature Preparation of Poly–Si TFT by Ar Laser Annealing at High Scanning Speed", Electronic Data and Communication Association C–2, vol. J76–C–2, No. 5, (pp. 256–259), May, 1993.

Electronic Data and Communication Association, vol. J76–C–2, No. 5, pp. 256–259, 1993, K. Masumo, et al., "Low Temperature Preparation of Poly–Si TFT By AR Laser Annealing With High Scanning Speed" (With English Translation, pp. 112–116).

IEEE Transactions on Electron Devices, vol. ED–27, No. 1, Jan. 1980, pp. 290–293, T. I. Kamins, et al., "A Monolithic Integrated Circuit Fabricated in Laser–Annealed Polysilicon".

J. Electrochem. Soc.: Solid–State Science and Technology, vol. 128, No. 9, pp. 1981–1986, Sep. 1981, H.W. Lam, et al., "Single Crystal Silicon–On–Oxide By A Scanning CW Laser Induced Lateral Seeding Process".

Electronics Letters, vol. 15, No. 14, pp. 435–437, Jul. 5, 1979, A.F. Tasch, et al., "Silicon–On–Insulator M.O.S-.F.E.T.S Fabricated On Laser–Annealed Polysilicon On $SiO_2$".

Appl. Phys. Lett. vol. 35, No. 2, pp. 173–175, Jul. 15, 1979, K.F. Lee, et al., "Thin Film Mosfet's Fabricated In Laser-–Annealed Polycrystalline Silicon".

Primary Examiner—Tom Thomas
Assistant Examiner—Fetsum Abraham
Attorney, Agent, or Firm—Oblon, Spivak, McClelland, Maier & Neustadt, P.C.

[57] ABSTRACT

A polycrystalline semiconductor thin film formed in a stripe shape on an insulating substrate wherein crystal particles are arranged in a line-texture form in a longitudinal direction of a stripe; an electric field effect mobility $v_L$ in a longitudinal direction of a stripe is different from an electric field effect mobility $v_S$ in a width direction of the stripe, and $v_L \geq 1.5 \cdot v_S$ is satisfied.

28 Claims, 15 Drawing Sheets

SCANNING SPEED = 10.5 m/s

SCANNING SPEED = 11 m/s

SCANNING DIRECTION

SPIRAL-SHAPED-TFT
USED IN BUFFER

POLYCRYSTALLINE SEMICONDUCTOR THIN FILM FOR SEMICONDUCTOR TFT ON A SUBSTRATE HAVING A MOBILITY IN A LONGITUDINAL DIRECTION GREATER THAN IN A WIDTH DIRECTION

BACKGROUND OF THE INVENTION

1. Field of the Invention

The present invention relates to a method of making a thin film transistor (TFT) used as a driving element for an active matrix type picture displaying device. In particular, the present invention relates to a polycrystalline semiconductor thin film formed by a high speed beam annealing method (HSBA) used in a step of polycrystallization; a method of forming the polycrystalline semiconductor thin film; a polycrystalline semiconductor TFT and a TFT substrate.

2. Discussion of Background

Heretofore, beam annealing has been used in order to form a polycrystalline semiconductor TFT. However, the conventional beam annealing is substantially for recrystallization by fusing a semiconductor thin film or for a heat treatment. In each case, heat induced by irradiation of beams does not largely rely on a scanning speed of a beam spot on an irradiated object. A conventional technique of fusing and recrystallizing will be described as a conventional Example 1.

Japanese Examined Patent Publication No. JP-B-3-34669 discloses a semiconductor device comprising a thin film transistor wherein polycrystalline Si having an increased particle size by annealing amorphous silicon or polycrystalline Si by laser beams is used. An important portion of the published invention in the conventional Example 1 is referred to in the following.

"$SiH_4$ is thermally decomposed at 580° C. by a LPCVD method to deposit a thin film of polycrystalline Si of 0.5 $\mu$m thick on an insulating substrate 1. Then, ion implantation of dose quantity of $3\times10^{12}$/cm of P (phosphor) as an N-type impurity is effected with a driving voltage of 150 KV. After a thermal treatment has been conducted at 900° C. for 30 minutes to uniform a distribution of impurities, the thin film is annealed with a power of 1.6 Joule/cm$^2$ with laser beams of the second harmonic wave (wavelength: 0.53 $\mu$m, beam diameter: 85 $\mu$m) of a YAG laser.

The irradiation of the laser beams is effected first in an x direction (left and right directions) at a scanning speed of 100 mm/sec, and then, the irradiation is effected in a y direction (front and back directions) which is perpendicular to the x direction. In the irradiation of the laser beams in two directions, the first irradiation in the x direction causes the growth of crystalline particles of polycrystalline Si mainly in the x direction, and the irradiation in the y direction rarely causes the growth of the crystalline particles in the y direction. For example, in the above-mentioned laser annealing conditions, the length of the crystalline particles growing in the x direction is about 10 $\mu$m, and the width of the crystalline particles growing in the y direction is about 1 $\mu$m. The laser annealing is for accelerating the growth of the crystalline particles and for electrical activation. When laser annealing is conducted with a power of less than 1.6 Joule/cm$^2$, activation is insufficient and desired characteristics are difficult to obtain."

In the next, a conventional Example wherein laser annealing is conducted under a non-fusion condition will be described. This is such a technique that high speed scanning of beam spot is conducted to obtain a polycrystalline semiconductor without causing a substantial increase of temperature in an irradiated object, and accordingly, without causing fusion of it. For example, Japanese Unexamined Patent Publication JP-A-62-104117 discloses that a hydrogenated amorphous silicon film can stably be polycrystallized. Further, Japanese Unexamined Patent Publication JP-A-4-226040 discloses that impurities implanted in the source-drain and the channel can simultaneously be activated.

Further, there is known, in Japanese Unexamined Patent Publication JP-A-5-208395, a method that a lens for thinning beams is used for an optical system of a beam annealing apparatus; the ratio of the length of a beam spot in a scanning direction to the width of the beam spot in the direction perpendicular to the scanning direction is changeable; and scanning of the beam spot is conducted at a linear speed of "length of beam spot in scanning direction ×100000/s or more", whereby higher productivity can be realized.

The dimensions of the beam spot defined in the conventional technique are dimensions corresponding to $1/e^2$ (13.5%), which is ordinarily used in laser technology.

Further, an article in the Electronic Data and Communication Association C-2 Vol. J76-C-2 No. 5 p. 256–p. 259 discloses an invention related to a low temperature process poly-Si-TFT obtained by HSBA argon laser annealing. In the article, there is description that "as a starting film used for HSBA, amorphous silicon having a large hydrogen content is used. Also, the concentration and a state of existence are unknown at the present time point, it can be confirmed by SIMS that it contains therein a relatively large amount of hydrogen. It is considered that the existence of hydrogen causes a so-called "self-hydrogenation" without using a technique of introducing hydrogen from the outside of the film, such as a hydrogen plasma treatment, a hydrogen-atmosphere annealing or the like."

Although the conventional technique using such HSBA method have provided stably a TFT characteristic of 20 cm$^2$/Vs or more in terms of electric field effect mobility, there has still been found a certain dispersion. In examination of the cause, it was found that the major part of the dispersion derived from the characteristics of the polycrystalline semiconductor itself. Specifically, it was found that there was clearly a distribution of TFT characteristics in a direction perpendicular to a scanning direction of energy beams which induce polycrystallization.

In consideration of this, the inventors of this application proposed in Japanese Patent Application JP6-228429 (Japanese Unexamined Patent Publication JP-A-8-97141) a HSBA method wherein light is irradiated to an amorphous silicon film at a strength of 80% or more with respect to the peak strength of laser beam for 3 $\mu$s–5 $\mu$s. The proposed method limited a range of distribution of TFT characteristics in comparison with the conventional HSBA method, and improves the overall characteristics of the TFT substrate.

Further, Japanese Unexamined Patent Publication JP-A-7-92501 (U.S. Pat. No. 5,589,406) describes a technique relating to a TFT substrate wherein a peripheral driving circuit and a pixel region are formed in a highly integrated form on a single substrate by contriving the scanning direction of laser beam and the circuit structure of TFT in the application of the HSBA method, whereby a product of stable performance can be provided at a high productivity.

In the adoption of the above-mentioned HSBA method wherein scanning of beam spot was conducted on an irradiated object at a high speed to polycrystallize the object without bringing a no-single crystalline semiconductor thin film into a completely fused state, when an optimum irradiation time was further determined, a TFT of further uniform quality could be obtained while a high productivity was maintained.

However, with the progress of technology, there have been an increased demand, and especially, a TFT having a further high electric field effect mobility has been seeked. Further, there have been demands for new problems such as large picture surface, high density, integration of peripheral circuits and improvement of manufacturing yield. Furthermore, a TFT display device having good uniformity and permitting stable manufacture has been required.

SUMMARY OF THE INVENTION

According to the first aspect of the invention, there is provided a polycrystalline semiconductor thin film formed in a stripe shape on an insulating substrate wherein an electric field effect mobility $v_L$ in a longitudinal direction of a stripe is different from an electric field effect mobility $v_S$ in a width direction of the stripe, and $v_L \geq 1.5 \cdot v_S$ is satisfied. Preferably, a polycrystalline semiconductor thin film satisfies $v_L \geq 3.0 \cdot v_S$. For the insulating substrate, a non-alkali glass substrate for LCD is generally used because it has a low softening temperature in comparison with a quartz substrate.

In the second aspect of the invention, there is provided a polycrystalline semiconductor thin film according to the first aspect wherein the electric field effect mobility $v_L$ is 55 cm$^2$/Vs or more. This invention is applicable to a high speed switching circuit.

According to the third aspect of the invention, there is provided a polycrystalline semiconductor thin film according to the first aspect wherein the electric field effect mobility $v_L$ is 200 cm$^2$/Vs or less.

In the fourth aspect of the invention, there is provided a polycrystalline semiconductor thin film according to the first aspect wherein polycrystalline particles are arranged in a line-texture form with respect to a scanning direction of the stripe.

In the fifth aspect of the invention, there is provided a polycrystalline semiconductor thin film according to the second aspect wherein polycrystalline particles are arranged in a line-texture form with respect to a scanning direction of the stripe.

In the sixth aspect of the invention, there is provided a polycrystalline semiconductor thin film according to the third aspect wherein polycrystalline articles are arranged in a line-texture form with respect to a scanning direction of the stripe.

In the seventh aspect of the invention, there is provided a polycrystalline semiconductor thin film according to the first aspect wherein the thin film is obtained by annealing an amorphous silicon semiconductor of 50 nm–150 nm thick containing silicon as the main component.

In the eighth aspect of the invention, there is provided a polycrystalline semiconductor thin film according to the second aspect wherein the thin film is obtained by annealing an amorphous silicon semiconductor of 50 nm–150 nm thick containing silicon as the main component.

In the ninth aspect of the invention, there is provided a polycrystalline semiconductor thin film according to the third aspect wherein the thin film is obtained by annealing an amorphous silicon semiconductor of 50 nm–150 nm thick containing silicon as the main component.

In the tenth aspect of the invention, there is provided a polycrystalline semiconductor thin film according to the fourth aspect wherein the thin film is obtained by annealing an amorphous silicon semiconductor of 50 nm–150 nm thick containing silicon as the main component.

In the eleventh aspect of the invention, there is provided a polycrystalline semiconductor thin film according to the fifth aspect wherein the thin film is obtained by annealing an amorphous silicon semiconductor of 50 nm–150 nm thick containing silicon as the main component.

In the twelfth aspect of the invention, there is provided a polycrystalline semiconductor thin film according to the sixth aspect wherein the thin film is obtained by annealing an amorphous silicon semiconductor of 50 nm–150 nm thick containing silicon as the main component.

In the thirteenth aspect of the invention, there is provided a polycrystalline semiconductor thin film according to the first aspect wherein hydrogen content is about 1 atm % or more.

In the fourteenth aspect of the invention, there is provided a polycrystalline semiconductor thin film according to the second aspect wherein hydrogen content is about 1 atm % or more.

In the fifteenth aspect of the invention, there is provided a polycrystalline semiconductor thin film according to the third aspect wherein hydrogen content is about 1 atm % or more.

In the sixteenth aspect of the invention, there is provided a polycrystalline semiconductor thin film according to the fourth aspect wherein hydrogen content is about 1 atm % or more.

In the seventeenth aspect of the invention, there is provided a polycrystalline semiconductor thin film according to the fifth aspect wherein hydrogen content is about 1 atm % or more.

In the eighteenth aspect of the invention, there is provided a polycrystalline semiconductor thin film according to the sixth aspect wherein hydrogen content is about 1 atm % or more.

In the nineteenth aspect of the invention, there is provided a polycrystalline semiconductor thin film according to the seventh aspect wherein hydrogen content is about 1 atm % or more.

In the twenties aspect of the invention, there is provided a polycrystalline semiconductor thin film according to the eighth aspect wherein hydrogen content is about 1 atm % or more.

In the twenty-first aspect of the invention, there is provided a polycrystalline semiconductor thin film according to the ninth aspect wherein hydrogen content is about 1 atm % or more.

In the twenty-second aspect of the invention, there is provided a polycrystalline semiconductor thin film according to the tenth aspect wherein hydrogen content is about 1 atm % or more.

In the twenty-third aspect of the invention, there is provided a polycrystalline semiconductor thin film according to the eleventh aspect wherein hydrogen content is about 1 atm % or more.

In the twenty-fourth aspect of the invention, there is provided a polycrystalline semiconductor thin film according to the twelfth aspect wherein hydrogen content is about 1 atm % or more.

In the twenty-fifth aspect of the invention, there is provided a polycrystalline semiconductor TFT which comprises the polycrystalline semiconductor thin film according to the first aspect, wherein the thin film is used for a channel of the polycrystalline semiconductor TFT, and the longitudinal direction of a stripe is substantially in parallel to the direction of the channel. "Substantially in parallel" means that the main axis direction of the crystalline in the stripe be within 15° with respect to the direction of a current flowing in the channel.

In the twenty-sixth aspect of the invention, there is provided a polycrystalline semiconductor TFT according to the twenty-fifth aspect wherein a source electrode and a drain electrode of the polycrystalline semiconductor TFT are formed in a comb-teeth form.

In the twenty-seventh aspect of the invention, there is provided a TFT substrate which comprises pixels formed in a matrix from, driving elements provided in respective pixels to drive them, a row driver circuit for supplying a row signal to a row electrode connected to driving elements, and a column driver circuit for supplying a column signal to a column electrode connected to a driving element, wherein the polycrystalline semiconductor TFT according to the twenty-fifth aspect is used for a part of the row driver circuit and/or a part of the column driver circuit.

In the twenty-eighth aspect of the invention, there is provided a TFT substrate wherein the polycrystalline semiconductor TFT according to the twenty-fifth aspect is used for at least one selected from the group consisting of s shift register in a row driver circuit, a correction circuit in the row driver circuit, a current amplifying buffer in the row driver circuit, and an output buffer in a column driver circuit.

In the next, description will be made on an invention of the second group which is related to a manufacturing method.

According to the first aspect of the invention of this group, there is provided a method of forming a polycrystalline semiconductor thin film having a crystallized structure by scanning and irradiating a beam spot on the thin film without fusing it wherein the scanning is effected at a scanning speed of 90–100% of a scanning speed $V_p$ which induces self-crystallization of an amorphous semiconductor thin film.

A lower region of the scanning speed $V_p$ is 90–100% and an upper region is 100–110%. In any region, a higher electric field effect mobility than the conventional examples is basically obtainable. In the present invention, it is preferable from the viewpoint of productivity that the scanning speed is selected from the region of 100–110%.

In the second aspect of the second group, there is provided a method of forming a polycrystalline semiconductor thin film according to the first aspect wherein an amorphous semiconductor includes silicon as the main component and has a film thickness of 50 nm–150 nm.

In the third aspect, there is provided a polycrystalline semiconductor TFT wherein the channel is formed by using a polycrystalline semiconductor thin film formed by the method of forming a polycrystalline semiconductor thin film according to the first aspect or the second aspect.

In the fourth aspect, there is provided a TFT substrate wherein a plurality of polycrystalline semiconductor TFTs are provided on an insulating substrate, and the polycrystalline semiconductor TFT according to the third aspect is provided at at least a part of it.

In the fifth aspect, there is provided a TFT substrate which comprises pixels formed in a matrix from, driving elements provided in respective pixels to drive them, a row driver circuit for supplying a row signal to a row electrode connected to a driving element, and a column driver circuit for supplying a column signal to a column electrode connected to a driving element, wherein the polycrystalline semiconductor TFT according to the third aspect is used for a part of the row driver circuit and/or a part of the column driver circuit.

In the sixth aspect, there is provided a TFT substrate wherein the polycrystalline semiconductor TFT according to the third aspect is used for at least one selected from the group consisting of s shift register in a row driver circuit, a correction circuit in the row driver circuit, a current amplifying buffer in the row driver circuit, and an output buffer in a column driver circuit.

The polycrystalline semiconductor TFT of the present invention is preferably used for a circuit system to which high speed switching and large current driving are in particular required.

In the above-mentioned aspects of the invention, it is preferable that the amorphous semiconductor is an amorphous silicon semiconductor containing hydrogen, and the polycrystalline semiconductor thin film is a polycrystalline silicon because polycrystallization can stable be conducted in a large scale production by using HSBA method.

Further, in the above-mentioned aspects of the invention, it is more preferable that the film thickness of the polycrystalline semiconductor thin film is 80 nm–130 nm because the polycrystalline silicon film can stably be formed and formation of circuits to be conducted afterward is easy.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

The present invention will be described with reference to the drawings.

Figure 1:
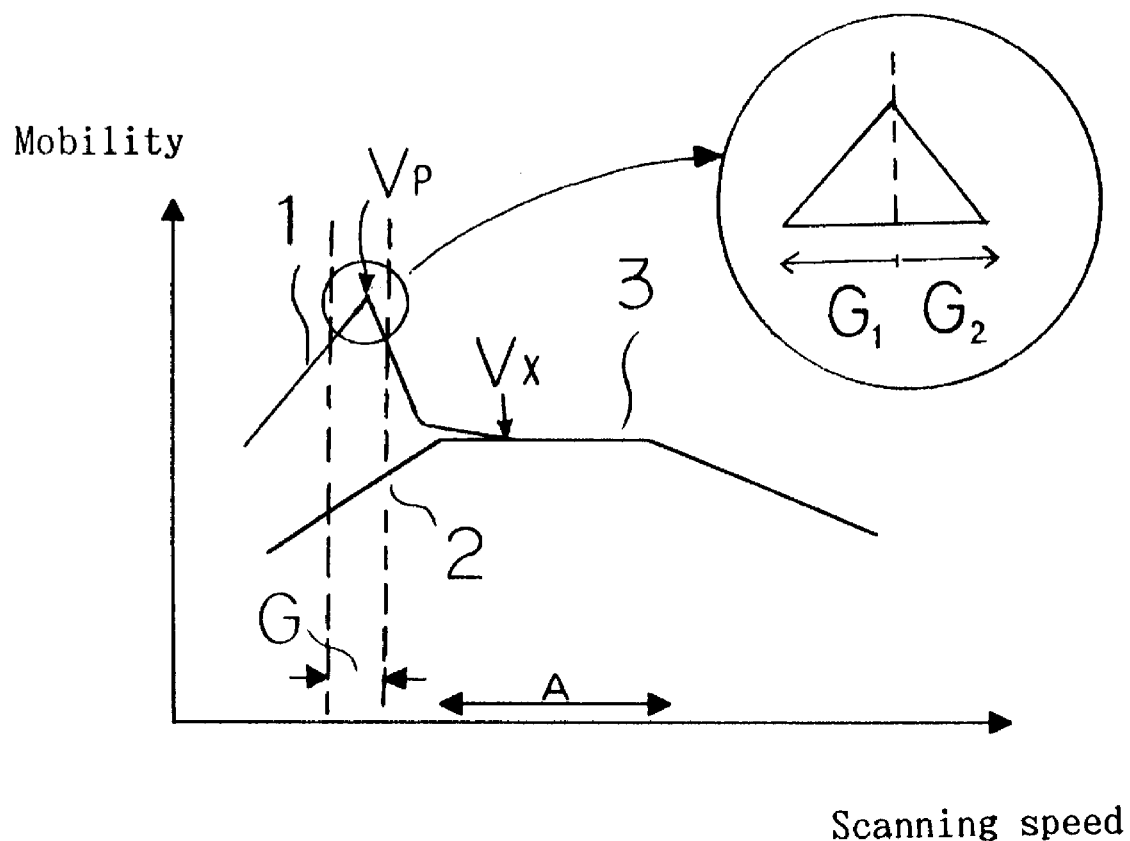
FIG. 1 is a characteristic diagram showing a correlation between electric field effect mobility of the polycrystalline semiconductor thin film and a scanning speed of the present invention.
Figure 13:
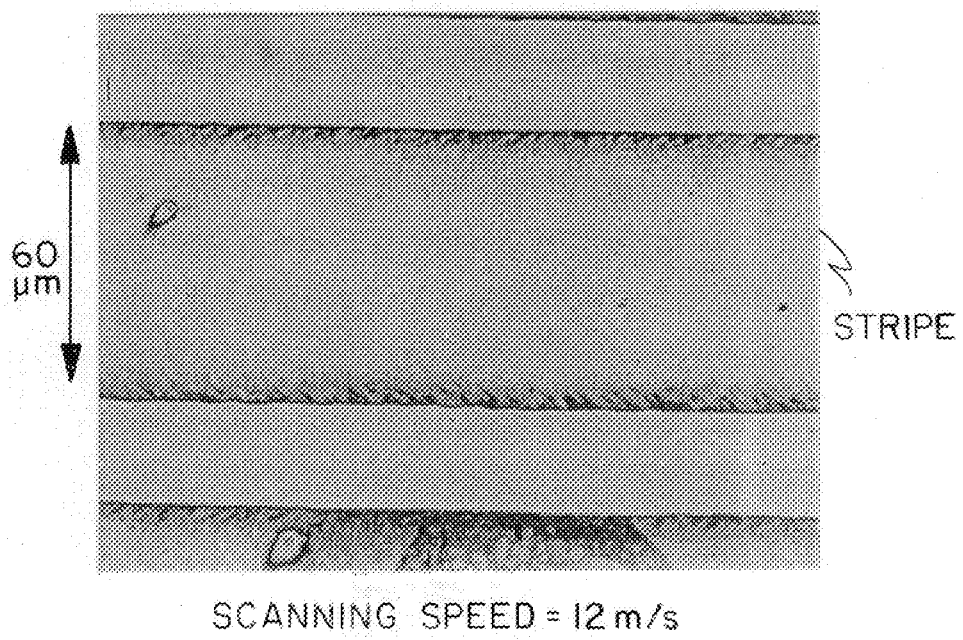
FIG. 13 is a picture showing the surface of the stripe at a scanning speed of 12 m/s.
Figure 14:
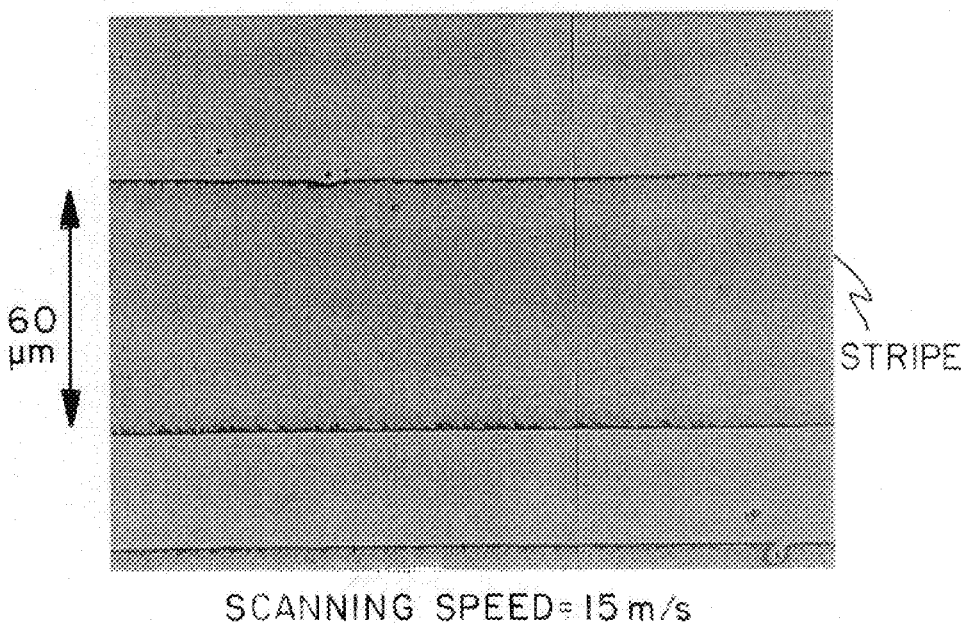
FIG. 14 is a picture showing the surface of the stripe at a scanning speed of 15 m/s.
Figure 15:
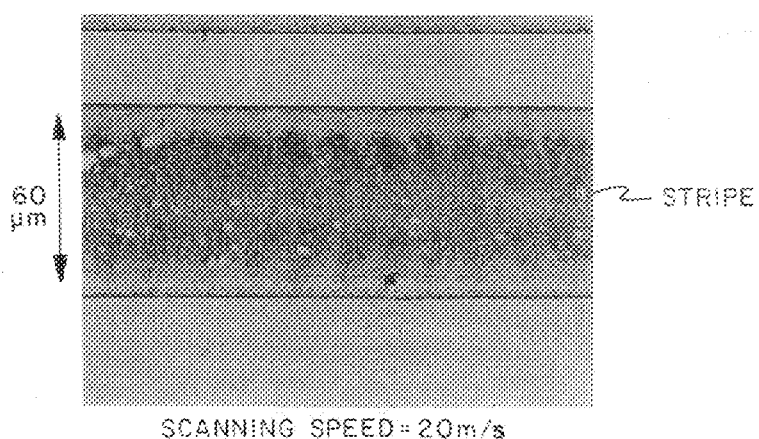
FIG. 15 is a picture showing the surface of the stripe at a scanning speed of 20 m/s.

FIG. 1 shows a correlation between an electric field effect mobility of a TFT and a scanning speed for beam annealing. In a region A in the abscissa, a certain degree of electric field effect mobility is obtainable in a stable manner. In a region where the scanning speed is faster than that of the region A, there is a dispersion of electric field effect mobility in a polycrystalline semiconductor. For example, there is a distribution of the electric field effect mobility in a width direction of a stripe in a polycrystallized region. Further, the electric field effect mobility exhibits a lower value as a whole. Polysilicon-Si stripes in FIG. 13 and FIG. 14 are almost in the region A of FIG. 1.

On the other hand, in the examination of a region G (including a region $G_1$ at the left side of a triangular shape and a region $G_2$ at the right side of it) where the scanning speed is slower than that of the region A, it was found that there appears a strong anisotropy in the characteristics of the electric field effect mobility as shown in FIG. 1. It was found that an electric field effect mobility $v_L$ in a direction parallel to the beam scanning shows a value of more than twice times as large as the value of the region A. A polycrystalline semiconductor TFT having a polycrystalline semiconductor thin film formed in the region G, which is so constructed as to be fed with a channel current in a direction parallel to the beam scanning direction, permits speedy switching operations and large current driving.

It was found that at this moment, the electric field effect mobility of the TFT in a direction perpendicular to the beam scanning direction, i.e., in a width direction of the stripe, is lower than that of the region A. In view of the fact, the scanning speed of beam annealing is determined so as to be in the largest region of the electric field effect mobility (e.g., when the peak value is $V_p$=10.5 m/s, the scanning speed is within about 9.5–11.6 m/s in the region G), and a stripe of polycrystalline semiconductor is formed in accordance therewith. Further, a circuit network for the TFT by which a channel current is supplied in a direction parallel to the beam scanning direction is designed. Thus, a TFT of high performance in which the electric field effect mobility is remarkably increased can be obtained.

The scanning speed by the beam spot which indicates the largest value in the electric field effect mobility is about 10 m/s in absolute value. However, the scanning speed is a progressing speed of voluntary crystallization due to a latent heat in crystallization or explosive crystallization, and varies slightly depending on kinds, physical properties and the like of an amorphous semiconductor thin film.

The progressing speed of voluntary crystallization (which is substantially equal to a scanning speed $V_p$ which induces voluntary crystallization of the amorphous semiconductor thin film) could be determined by stepwisely changing a scanning speed in HSBA method and by analyzing the orientation of the obtained crystal particles of the amorphous semiconductor thin film by an X-ray diffraction method. The inventors have been able to know the value of $V_p$ by repeating experiments on various amorphous semiconductor thin films and conditions in HSBA method (such as laser output, the diameter and the shape of a beam spot, scanning speed and so on).

Description will be made on physical properties of a polycrystalline semiconductor thin film formed by HSBA method according to the present invention. A scanning speed which begins to indicate anisotropy in the polycrystalline semiconductor thin film by gradually lowering the scanning speed from a faster speed side is called a critical scanning speed $V_x$. Namely, although a polycrystalline semiconductor thin film formed in a region where the scanning speed is faster than $V_x$ exhibits a random orientation, a polycrystalline semiconductor thin film formed in a region where the scanning speed is slower than $V_x$ exhibits anisotropy. Further, there is $V_p$ which indicates a peak or the largest region of the electric field effect mobility at a position where the scanning speed is slower than $V_x$. A polycrystallization semiconductor thin film formed by a scanning speed in a range including $V_p$ and its vicinity indicates a (111) orientation.

Figure 2:
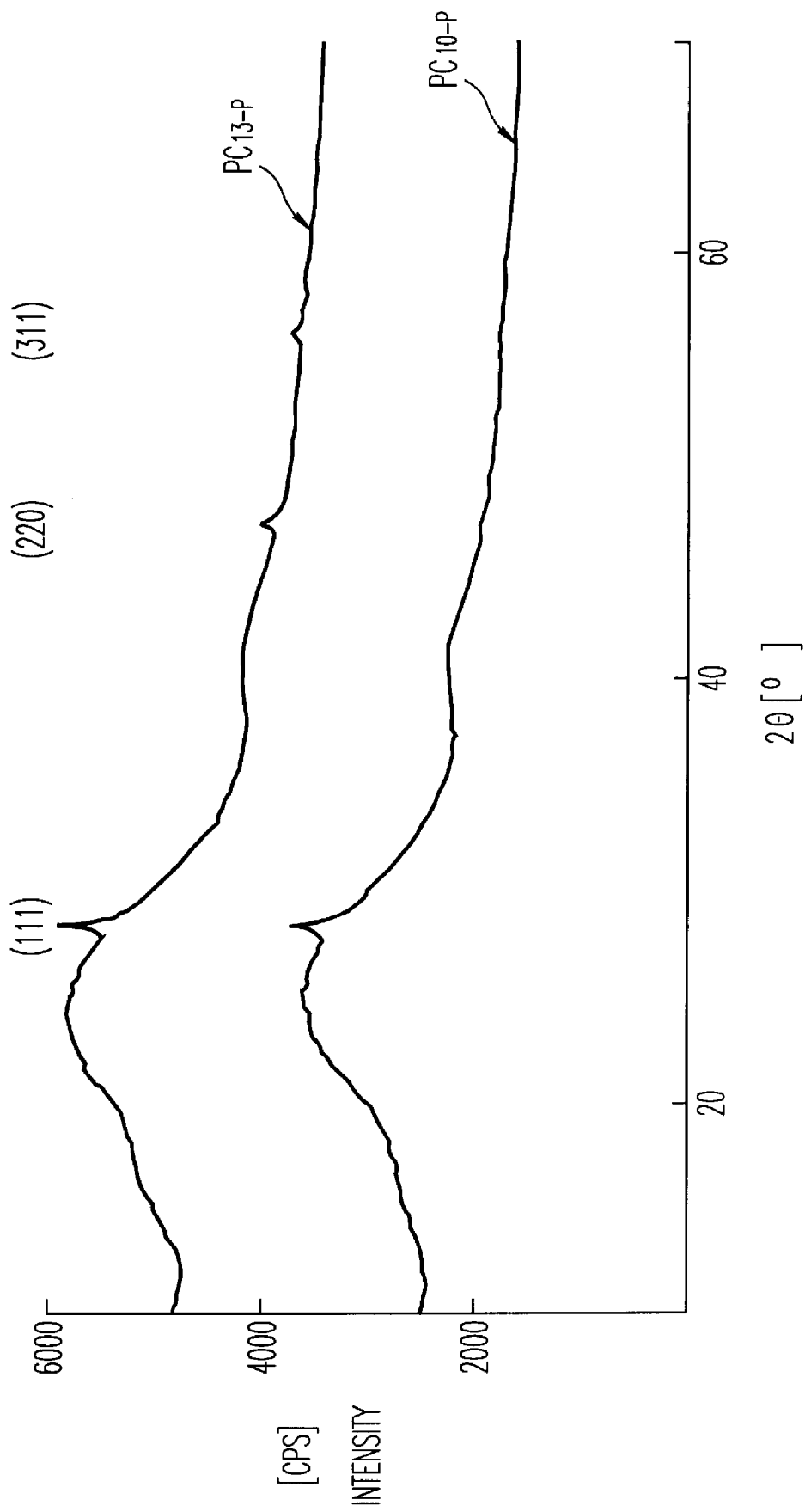
FIG. 2 is a characteristic diagram showing orientation of crystal particles in a polycrystalline silicon by HSBA method.

This is a polycrystalline semiconductor thin film which substantially has only a (111) orientation and does not indicate another orientation and which indicates substantially only one crystalline orientation. FIG. 2 shows a result of analysis. A characteristic curve of $PC_{13-p}$ designates a polycrystalline silicon semiconductor thin film formed by HSBA method in the region A at a scanning speed of 13 m/s. A characteristic curve of $PC_{10-p}$ designates a polycrystalline silicon semiconductor thin film formed by HSBA method in the region G at a scanning speed of 10 m/s.

These characteristic curves of $PC_{13-p}$ and $PC_{10-p}$ are obtained by analyzing stripes of the polycrystalline semiconductor thin film by an X-ray diffraction method, and show the orientation of crystal particles. The film structures used for experiments were prepared by forming a $SiO_2$ film of 200 nm thick on AN635 of 1.1 mm thick (a non-alkali glass substrate made by Asahi Glass Company) and by forming a polycrystalline silicon semiconductor thin film of 100 nm thick by HSBA method.

The characteristic curve $PC_{13-p}$ includes three peaks of (111), (220) and (311) as crystalline orientation. On the other hand, in the characteristic curve $PC_{10-p}$, there is a peak of (111), however, peaks of (220) and (311) are not observed. Thus, there is a clear difference in crystalline orientation of the polycrystalline silicon semiconductor. Further, it was found that such tendency is not rely on an in-plane direction of the polycrystalline silicon semiconductor, but was substantially universal.

Figure 3:
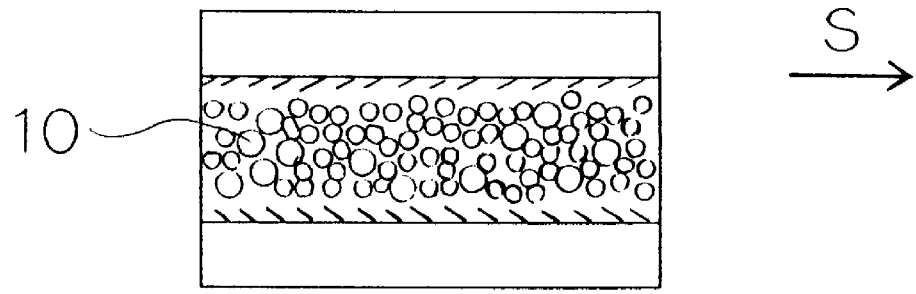
FIG. 3 is a schematic view showing a surface of a polycrystalline stripe in a Comparative Example (13 m/s)
Figure 4:
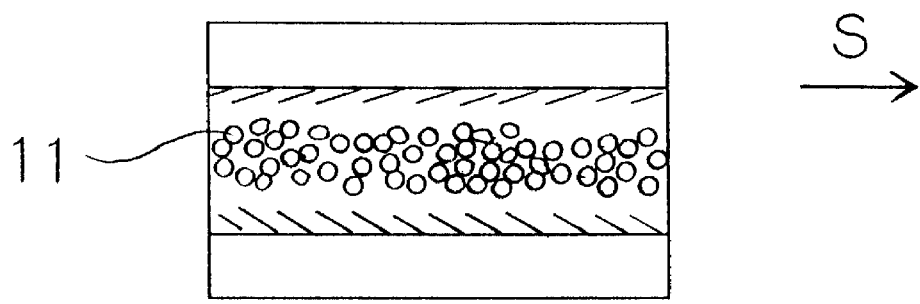
FIG. 4 is a schematic view showing a surface of a polycrystalline stripe in an Example (11 m/s) of the present invention.
Figure 5:
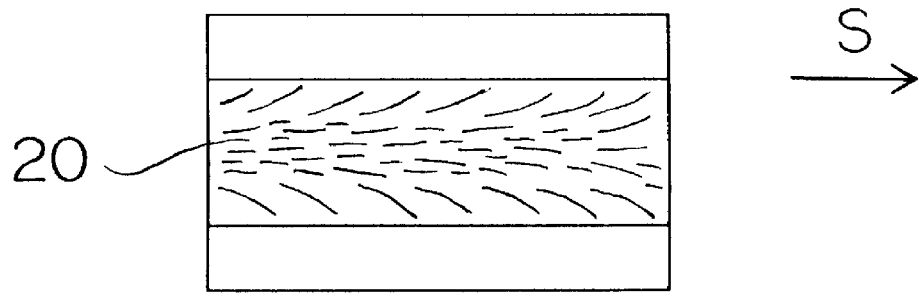
FIG. 5 is a schematic view showing a surface of a polycrystalline stripe in an Example (10 m/s) of the present invention.

Instead of using the X-ray diffraction method to observe the crystalline orientation, another method was used. Namely, the films were examined by etching with a hydrazine water solution the surface of the polycrystalline semiconductor thin films to observe it with an optical microscope, whereby judgement as to whether or not the scanning speed is faster than $V_p$ can be made. In other words, the value of $V_p$ in a certain amorphous semiconductor thin film can be obtained. When a scanning speed is faster than $V_p$, a central portion of the polycrystallized stripe exhibits a fine isotropic particle shape (crystal particles 10 in FIG. 3 and crystal particles 11 in FIG. 4). On the other hand, when a scanning speed is slower than $V_p$, particles having a shape elongated in a direction parallel to a scanning direction are observed in the entire portion of the stripe (a string-like state of crystal in FIG. 5). A state wherein crystal particles are arranged in a line-texture form in a direction parallel to the scanning direction could be observed.

$V_p$ thus obtained was 10.5 m/s in a case of an amorphous silicon film formed at 300° C. by a plasma CVD and heat-treated at 350° C., and was 11.5 m/s in a case of an amorphous silicon film formed at 430° C. by a LPCVD. In further analysis, it was found that a high electric field effect mobility could be obtained in a range of a scanning speed of $V_p\cdot(0.90-1.10)$ with respect to $V_p$. Further, when an allowable error or a stability constant in manufacturing is considered and scanning of a beam spot is conducted at a scanning speed in consideration of a stability margin, the highest electric field effect mobility can be obtained in a stable manner. Preferably, a condition of $V_p\cdot(0.93-1.07)$ is used. Namely, laser annealing should be conducted in the vicinity of $V_p$ in order to obtain a high mobility. When the scanning speed is too slow, the electric field effect mobility decreases because it is considered that there appears periodicity in the crystallization of the film due to a difference between the scanning speed and $V_p$.

$V_p$ is a scanning speed corresponding to the largest value or the largest region of the characteristic curve shown in FIG. 1. Preferably, a range of $V_p\cdot(0.93-0.96)$ or $V_p\cdot(1.04-1.07)$ is used. Since a change of the electric field effect mobility is steep in the vicinity of $V_p$, employment of the above-mentioned range is preferable for stabilizing a dispersion for each lot of manufacturing completed polycrystalline semiconductor TFTs.

It was found that in a region of upper position, a high speed side was preferable in manufacturing. Although manufacturing is possible even at a scanning speed of low speed side (an area at the left side on the paper surface from the peak point of the graph in FIG. 1) with respect to $V_p$, it is preferable to use a scanning speed of slightly high speed side with respect to $V_p$ (an area of right side on the paper surface from the peak point of the graph in FIG. 1).

In HSBA method, a scanning speed for beam annealing is the first parameter because it is a moving speed of isothermal area. The size of a beam for scanning is the second parameter to determine a tolerance between the scanning speed and $V_p$. As a value of the actual size of a beam, a range of 70 μm–150 μm is appropriate because this range allows the formation of a polycrystalline semiconductor thin film of excellent characteristics even when the different between the scanning speed and $V_p$ is within 10%.

In the present invention, the size of a beam spot is defined as the diameter or the size corresponding to $1/e^2$ in the same manner as the above-mentioned conventional example. The hydrogen content of an amorphous semiconductor thin film is a secondary parameter. For stable polycrystallization, a value of about 15 atm % or less is preferable (PECVD≧300° C.) and a value of about 2 atm % is preferable (LPCVD). There is tendency that as the film thickness is thicker, the value is smaller, and as the scanning speed is faster, the value is smaller. In order to avoid a defect in a polycrystalline semiconductor thin film, it is desirable that the hydrogen content of an amorphous semiconductor thin film is about 0.5 atm % or more.

The hydrogen content is reduced to be about 15–40% by HSBA step. HFS measurement shows 35% in LPCVD and PECVD a-Si (two samples).

Further, a laser output is also a secondary parameter, and an appropriate value should be used depending on film conditions and a scanning speed. When an output is slightly smaller than the optimum value, the characteristics of the stripe at a central portion does not substantially change although the width of the stripe to be polycrystallized becomes small.

Figure 8:
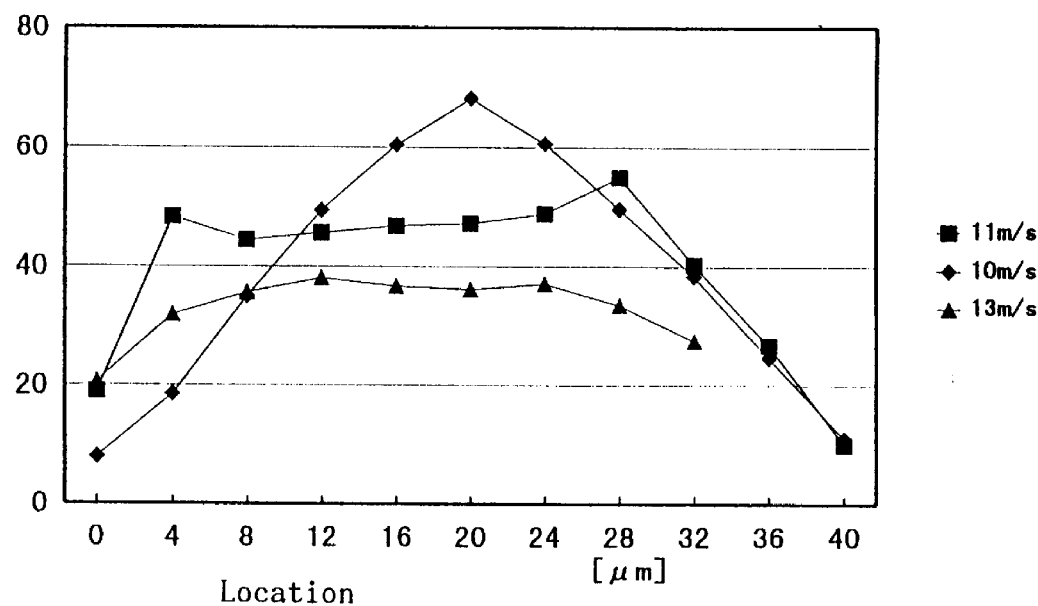
FIG. 8 is a characteristic diagram showing a relation between electric field effect mobility and positions in a width direction of a stripe wherein a change of scanning speed is a third parameter.
Figure 9:
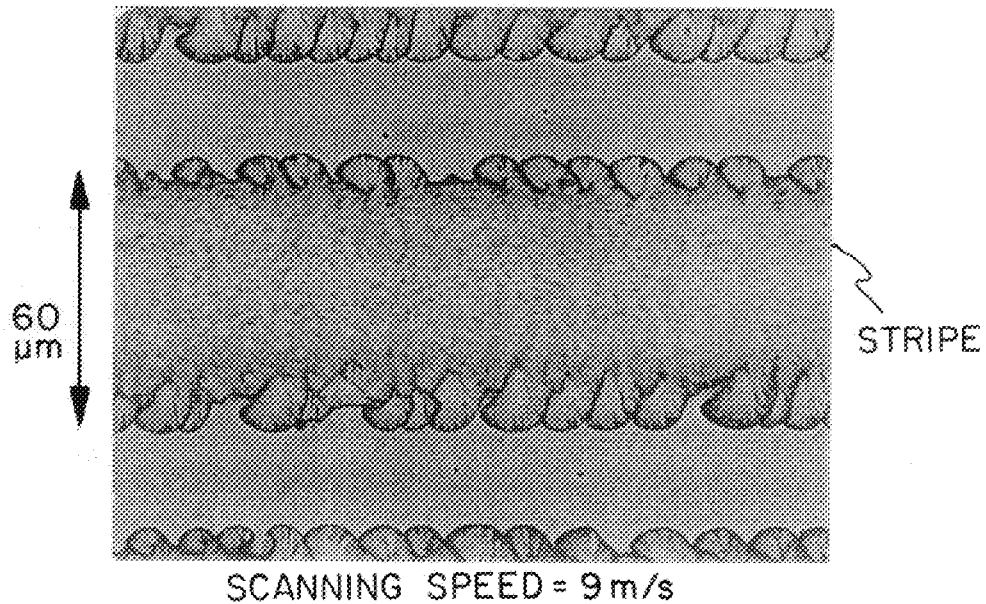
FIG. 9 is a picture showing a surface of a stripe at a scanning speed of 9 m/s.
Figure 10:
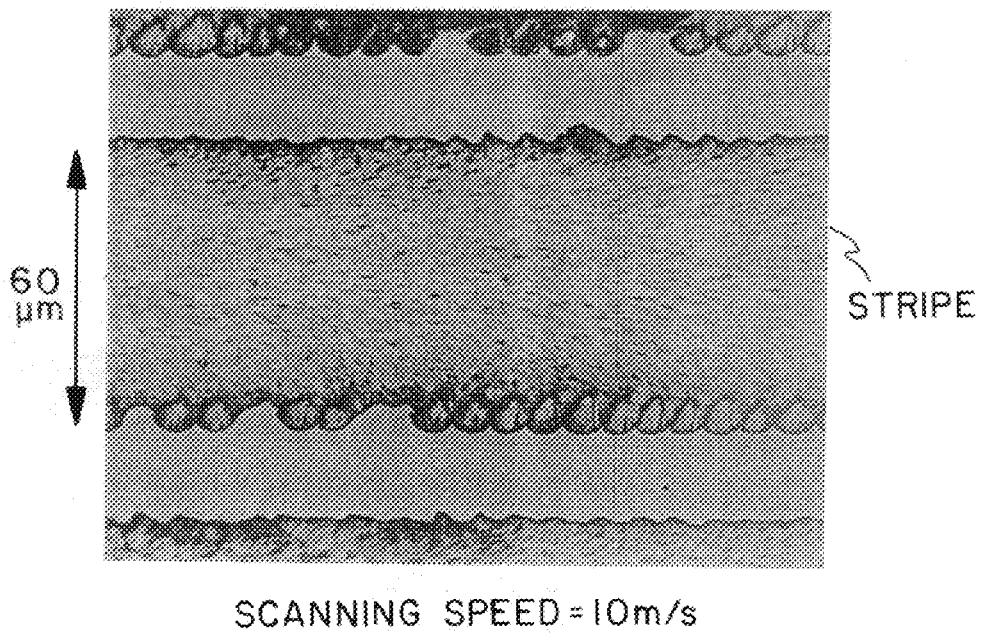
FIG. 10 is a picture showing the surface of the stripe at a scanning speed of 10 m/s.
Figure 11:
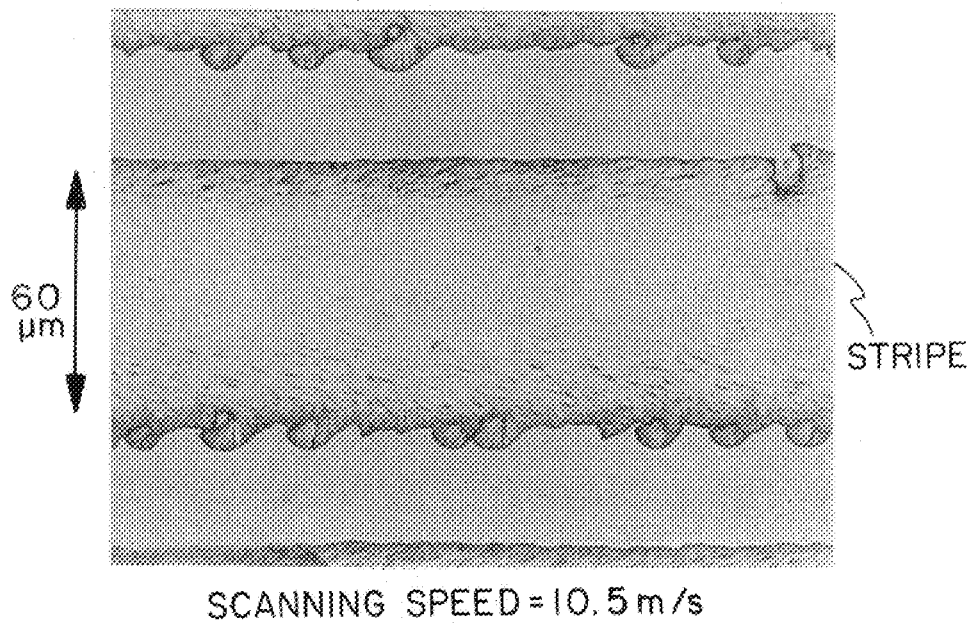
FIG. 11 is a picture showing the surface of the stripe at a scanning speed of 10.5 m/s.
Figure 12:
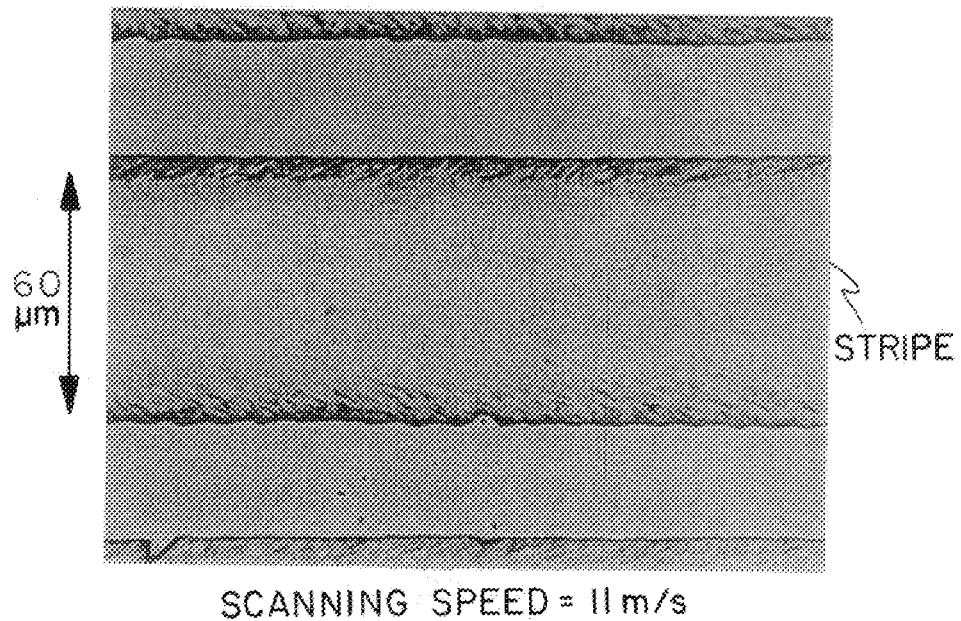
FIG. 12 is a picture showing the surface of the stripe at a scanning speed of 11 m/s.

FIG. 8 is a graph showing a result of distributions of electric field effect mobility in a width direction of a polycrystalline stripe of TFTs wherein a scanning direction is the same as a current feeding direction. The TFTs were prepared as follows. Films were formed at 300° C. by a plasma CVD followed by a heat treatment at 350° C. to form amorphous silicon films. The films underwent laser scanning at a scanning speed of 10.0 m/s ($V_p\cdot0.95$), 11.0 m/s ($V_p\cdot1.05$), and 13.0 m/s ($V_p\cdot1.24$) to polycrystallize them.

The width of the channel of each of the TFTs is 4 μm. a scanning speed of 10.0 m/s increases the mobility at a central portion of the stripe. However, the width of a region of high mobility is relatively narrow. Accordingly, there is a case that the condition of 11.0 m/s is advantageous in balance of alignment of position, required mobility and uniformity. Although the condition of 11.0 m/s is not beyond the effect of 10.0 m/s in terms of the highest mobility, it provides about 30% larger mobility than that of 13 m/s with the equivalent uniformity. Further, as the scanning speed is faster, productivity is improved.

The characteristics of the polycrystalline silicon film of the present invention will be described.

Figure 16:
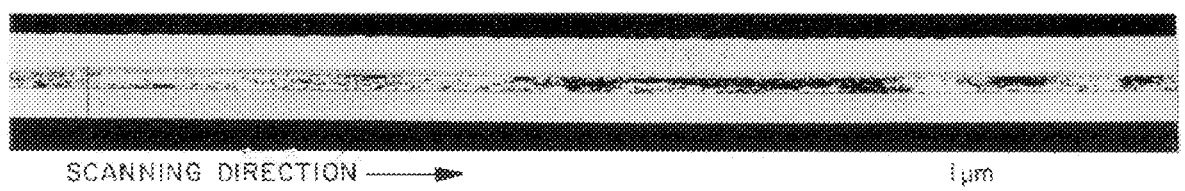
FIG. 16 is a TEM picture in a cross-sectional direction of the stripe.

FIG. 16 shows a picture by using a transparent type electron microscope, of a cross-sectional surface in parallel to a laser scanning direction of a polycrystalline silicon film formed by laser scanning at 10 m/s.

The shape of crystal particles is not constant as a whole, and particle-particle boundaries are unclear. However, the picture shows a state that regions having the same contrast (regions having the same azimuth) are continuous over several micron meters in the scanning direction although the continuous state is irregular. This means that crystal particles having a size equal to or smaller than the film thickness are arranged in the scanning direction with alignment of azimuth. It is considered that a state of the crystal particles can provide a large mobility in the scanning direction.

Figure 17:
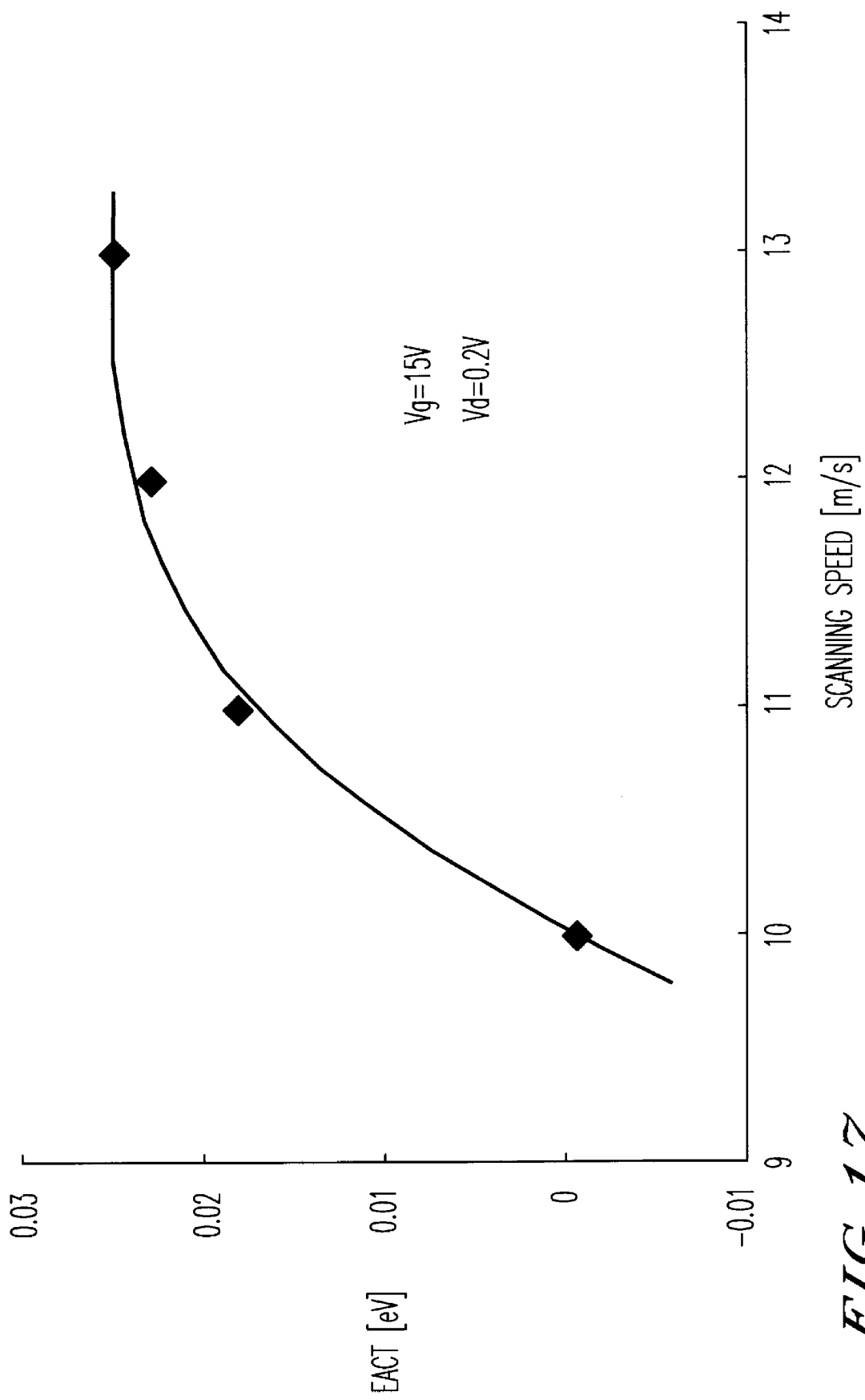
FIG. 17 is a graph showing a correlation between scanning speed and activation energy of ON current (Eact)
Figure 18A:
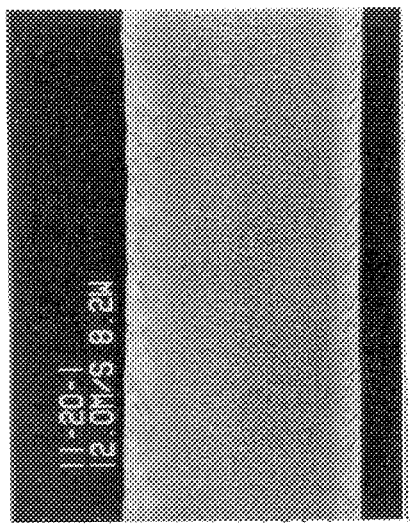
FIG. 18 is a optical microscope picture showing a laser annealed 4 polysilicon-Si stripes,
(a) a Comparative Example at speed=12.0 m/s and laser power=8.2W,
(b) present invention at 10.0 m/s and 7.4W,
(c) prior art at 13.0 m/s and 8.4W,
(d) present invention at 11.0 m/s and 8.0W, a-Si was prepared by PECVD and spot size is 100 $\mu$m/140 $\mu$m.
Figure 18B:
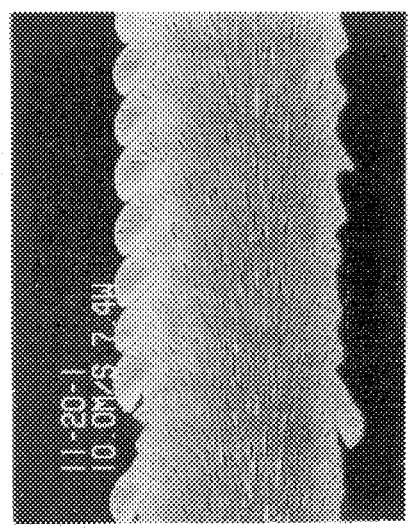
Figure 18C:
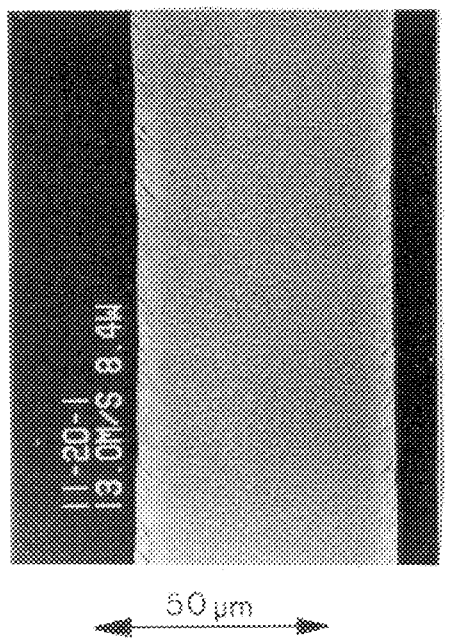
Figure 18D:
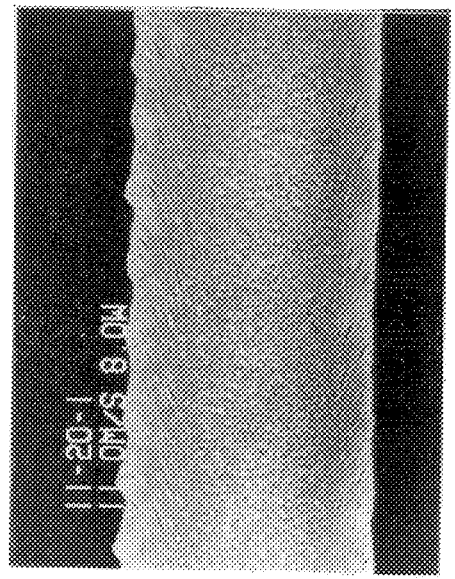
Figure 19:
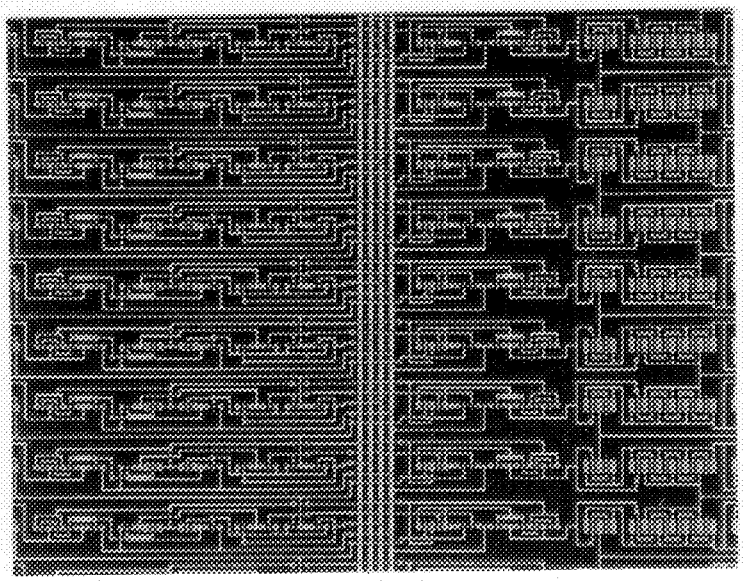
FIG. 19 is a optical microscope picture showing a gate driver circuit of the present invention including a logical circuit (left side) and a buffer circuit using spiral shaped TFT (a source-drain pattern formed in a comb-teeth and a gate pattern formed in a zig-zag or winding or spiral shape)
Figure 20:
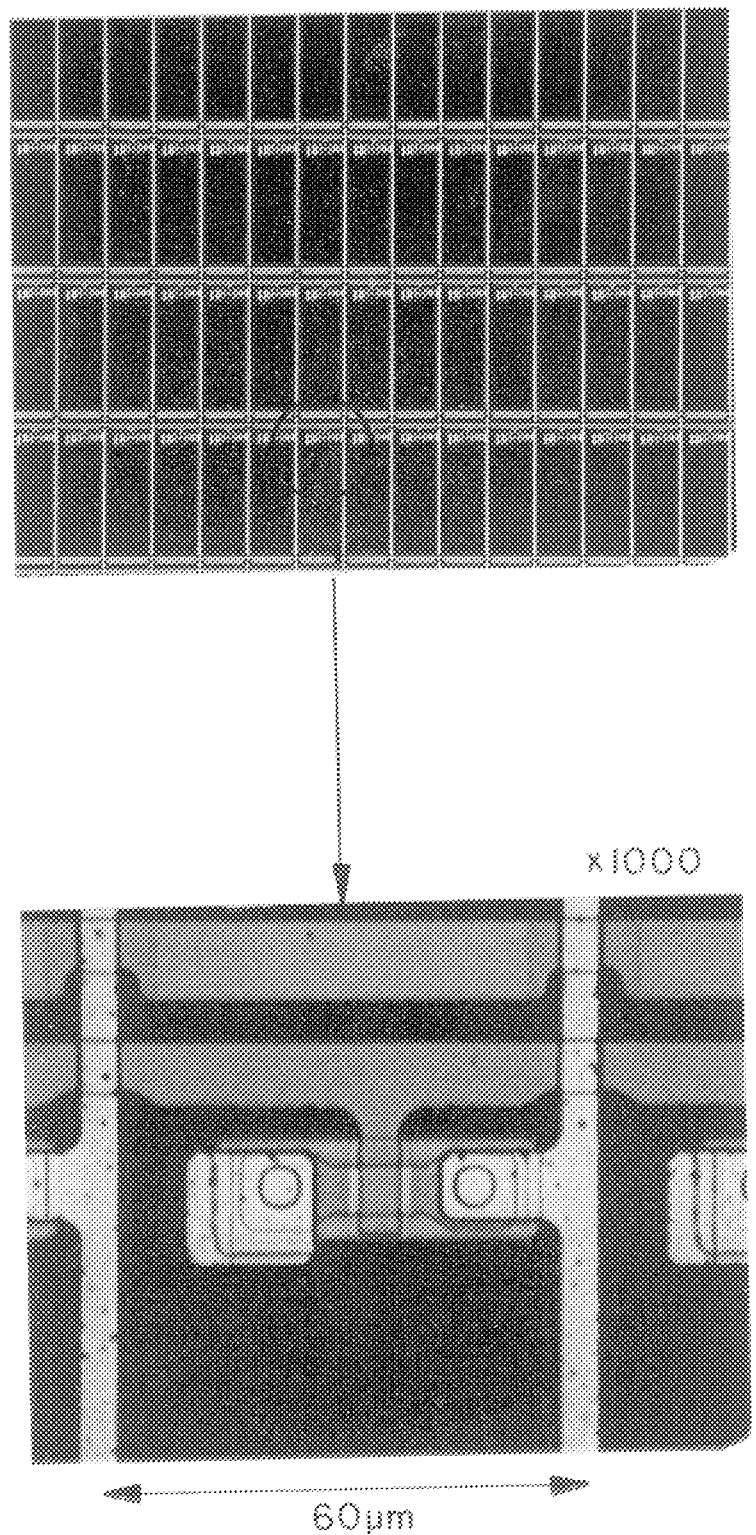
FIG. 20 is a optical microscope picture showing a pixel array in a display region and a pixel-TFT using a polysilicon-Si prepared by HSBA (present invention).

FIG. 17 is a graph showing how activating energy of an ON current to a TFT in which the current is supplied in parallel to a laser scanning direction, depends on a scanning speed for laser annealing. It is considered that the activating energy of ON current corresponds to a barrier energy at the particle boundaries of crystal. When the scanning speed is reduced, the activating energy decreases. The activating energy is almost 0 at 10 m/s. This indicates that amount of defects at the particle boundaries of crystal is very small at the scanning speed of 10 m/s.

Two kinds of polycrystalline silicon TFTs were prepared in the same manner as above except for a forming step of the polycrystalline silicon film. In a polycrystalline silicon TFT using a polycrystalline silicon film formed by a heat treatment of 600° C. for 72 hours to cause growth in solid phase, the activating energy of ON current was 0.06–0.07 eV. In a polycrystalline silicon TFT using a polycrystalline silicon film formed by irradiating 10 times with 300 mJ of KrF excimer laser, the activating energy of ON current was 0.03–0.04 eV. According to the method of the present invention, it is possible to obtain a polycrystalline silicon film having an extremely small energy barrier at the particle boundaries of crystal.

The content of hydrogen will be described. The polycrystalline silicon film of the present invention contains a relatively large amount of hydrogen atoms. For example, Jpn. J. Appl. Phys. Vol. 28 p,1789–1793 discloses that the hydrogen concentration in a polycrystalline silicon film polycrystallized by an excimer laser annealing method is 0.2 atm % or less.

Further, Japanese Unexamined Patent Publication JP-A-4-311038 discloses that an amorphous silicon film of hydrogen concentration of 0.08–0.8 atm % is suitable for a starting material to conduct crystallization by a heat treatment.

Also, hydrogen concentration in the thickness direction is substantially uniform. Measurements were conducted by Hydrogen Forward Scattering (HFS) method.

In the polycrystalline silicon of the present invention, an amorphous silicon film of hydrogen concentration of about 10–20 atm % was used as a starting material in a process wherein a plasma CVD was used at the highest temperature of about 350° C., which of course depends on conditions of forming the thin film. The hydrogen concentration of the obtained polycrystalline silicon film was at least 1 atm % and about 1.6–5.0 atm %.

In a process wherein disilane was used as raw material gas and a LPCVD was used at the highest temperature of about 450° C., an amorphous silicon film of hydrogen concentration of about 2 atm % was used as a starting material, and the hydrogen concentration of the obtained polycrystalline silicon film was about 0.5 atm %. It is considered that a relatively large amount of hydrogen atoms contained in the film can sufficiently seal the dangling bond whereby a fault at the particle boundaries is reduced to improve the mobility.

Now, the present invention will be described in further detail with reference to Examples. However, it should be understood that the present invention is by no means restricted by such specific Examples.

Examples 1, 3, 5 through 15, 17, 18 and 20 concern the present invention, and Examples 2, 4, 16 and 19 concern Comparative Examples.

EXAMPLE 1

A light shielding film was formed on a glass substrate by using a Cr thin film of a thickness of 80 nm. The light shielding film was subjected to a patterning treatment. On the patterned film, a $SiO_2$ film, an amorphous silicon film and a $SiN_x$ film as an antireflection film were formed in this order at 300° C. by a plasma CVD to have a thickness of 800 nm, 120 nm and 50 nm, respectively. The films were heated at 350° C. Then, laser annealing was conducted to polycrystallize the amorphous silicon film by using as a beam source an argon ion laser of continuous oscillation mode. The beam diameter of the laser on the substrate surface was in such a condition that the energy density reached 13.5% of the maximum value, and the beam spot had dimension of 100 μm in a scanning direction and 140 μm in the direction perpendicular to the scanning direction. Polycrystallization of the amorphous silicon film was conducted by a scanning speed of 10 m/s and a laser output of 7.0W. Since $V_p$ of the amorphous silicon film of this Example was 10.5 m/s, the scanning speed coefficient K as the ratio of scanning speed/$V_p$ was 95.2%.

On the polycrystalline silicon film, n-channel TFTs which feed an electric current in a direction parallel to the beam scanning direction were formed. The TFTs had a self-alignment coplanner structure in which sources and drains were formed by an ion implantation method. An insulating film for gates was formed by a plasma CVD. The electric field effect mobility $v_L$ of the TFTs formed of a polycrystalline silicon semiconductor stripe was 70 $cm^2$/Vs. The electric field effect mobility $v_S$ in a direction of width of the stripe was 20 $cm^2$/Vs. In this case, $v_L/v_S$ was 3.5 times.

EXAMPLE 2

A polycrystalline film was formed by HSBA method in the same manner as in Example 1 except that the laser output was 8.4W and the scanning speed was 13 m/s. The electric field effect mobility of this Example was 38 $cm^2$/Vs, which was substantially constant without depending on the scanning direction.

EXAMPLE 3

On a glass substrate, a $SiO_2$ film was formed at 300° C. by a sputtering method, an amorphous silicon film was formed at 400° C. by a LPCVD method, and then, a $SiN_x$ film as an antireflection film was formed by a sputtering method to have thicknesses of 200 nm, 100 nm and 50 nm, respectively. The films was polycrystallized by HSBA method by using as a beam source an argon ion laser of continuous oscillation mode. The size of the beam on the substrate was in such a condition that the energy density reached 13.5% of the maximum value, and the beam size had dimensions of 80 μm in the scanning direction and 100 μm in the direction perpendicular to the scanning direction.

Polycrystallization of the amorphous silicon film was conducted at a scanning speed of 11 m/s and a laser output of 8.0W. Since $V_p$ of the amorphous silicon film in this Example was 11.5 m/s, the scanning speed coefficient K as the ratio of scanning speed/$V_p$ was 95.6%.

On the polycrystalline silicon film, n-channel TFTs which feed an electric current in the direction parallel to the beam scanning direction were formed. The TFTs had a self-alignment coplanner structure in which sources and drains were formed by an ion implantation method. A $SiO_2$ film as an insulating film for gates was formed by a vacuum plasma CVD. The electric field effect mobility $v_L$ of the TFTs was 110 $cm^2$/Vs. The electric field effect mobility $v_S$ in the direction of width of the stripe was 35 $cm^2$/Vs. In this case, $v_L/v_S$ was 3.1 times.

EXAMPLE 4

TFTs were formed in the same manner as in Example 3 except that the scanning speed was 13 m/s and the laser output was 8.6W. The electric field effect mobility was 45 $cm^2$/Vs, which was substantially constant without depending on the scanning direction.

EXAMPLE 5

Figure 6:
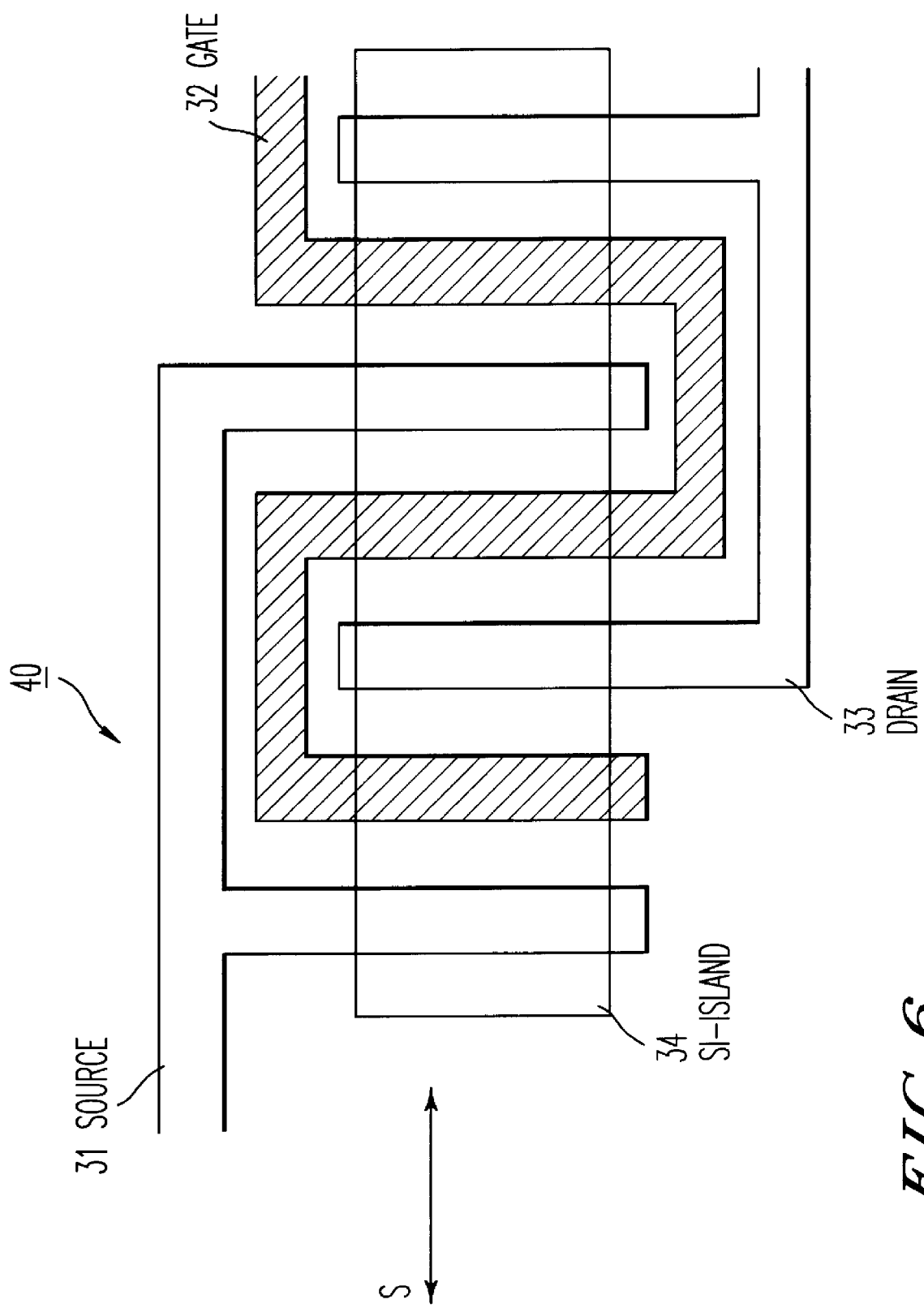
FIG. 6 is an enlarged plane view showing a part of the polycrystalline semiconductor TFT of the present invention.

Stripes of polycrystalline silicon semiconductor were formed on a glass substrate in the same manner as in Example 1. Patterning by photolithography was conducted to the polycrystalline silicon to obtain an island-like pattern whereby TFTs were formed. FIG. 6 is a plane view of a formed pattern. A source 31, a gate 32, a drain 35 and a silicon island 34 of polycrystalline silicon semiconductor were formed wherein the source 31 and the drain 35 were opposed in a comb-teeth like form, the gate 32 is in a spiral form and the direction of feeding an electric current in the channel was in the same direction as the scanning direction S in HSBA method. Arrangement was so made as to use a higher value of $v_L$ by utilizing anisotropy in the electric field effect mobility of the polycrystalline silicon semiconductor.

The measurement of the operating characteristics of TFTs, it was found the performance capable of feeding an effective drain current of the order of 0.1–1 mA. The TFTs can be used for a driving circuit in a peripheral driving circuit for which a high driving performance is required. Further, a switching speed was sufficiently quick and the peripheral circuit could be formed in one piece.

EXAMPLE 6

Figure 7:
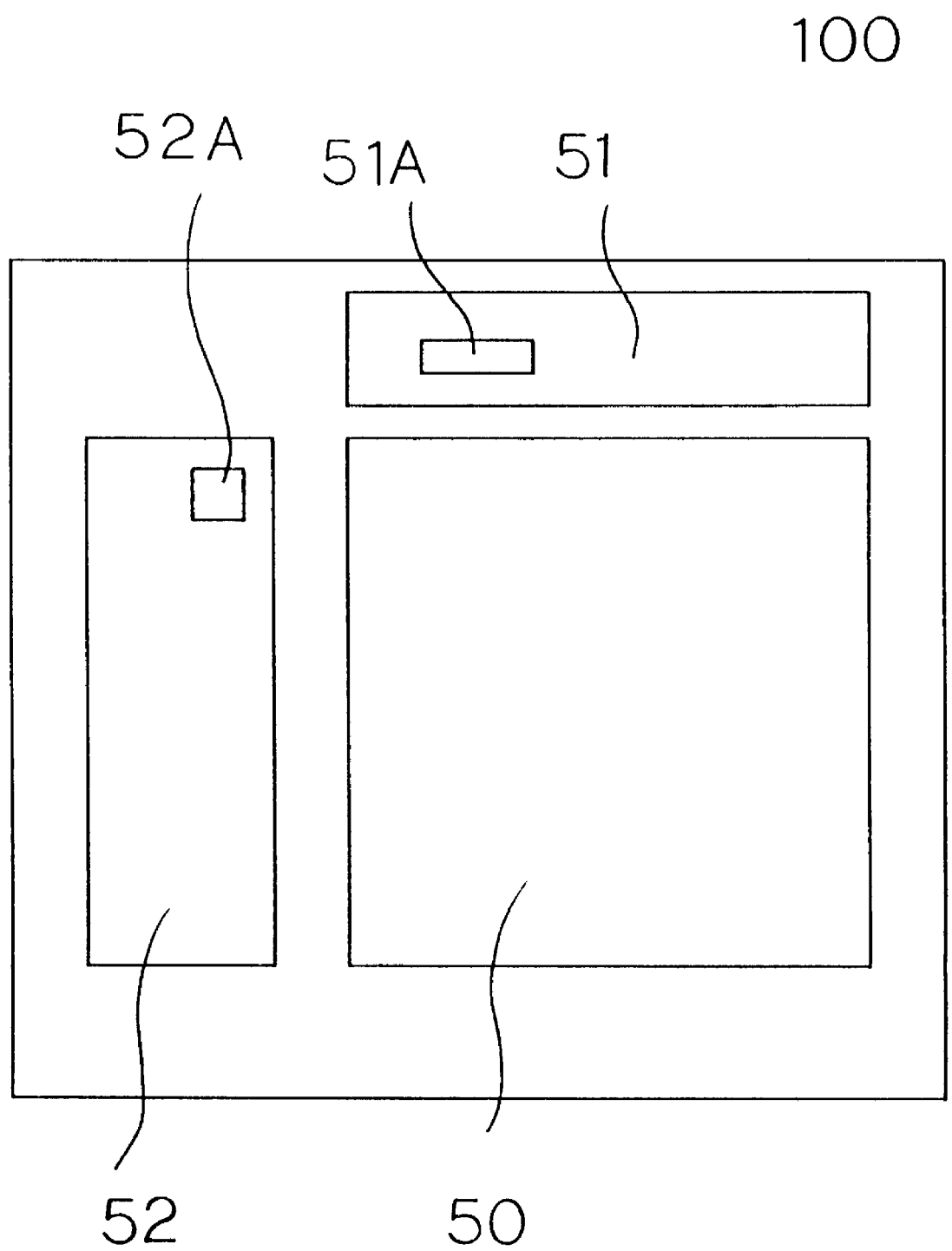
FIG. 7 is a plane view of the TFT substrate of the present invention.

Stripes of polycrystalline silicon semiconductor were formed on a glass substrate in the same manner as in Example 1, and a TFT substrate 100 for a liquid crystal display device was formed wherein a matrix of pixels was 768×1024, and a low driver circuit 52 and a column driver circuit 51 were formed in one piece on the glass substrate, which is shown in FIG. 7 of plane view. The TFT structure of Example 5 was adopted for a part of shift registers in the column driver circuit 51 and the low driver circuit 52 and a final buffer 51A of the TFT substrate 100.

An aligning treatment was conducted; and then, an opposing substrate was attached to the TFT substrate. The peripheral portion of the opposed substrates was sealed to form an empty cell. Liquid crystal was filled in the cell to complete a liquid crystal display device. As a result of operating tests on video pictures, an excellent display was obtained.

EXAMPLE 7

A polycrystalline film was formed by HSBA method in the same manner as in Example 1 except that the laser output was 7.6W and the scanning speed was 11 m/s. The electric field effect mobility $v_L$ of TFT in this Example was 47 cm$^2$/Vs. The electric field effect mobility $v_S$ in the direction of width of the stripe was 26 cm$^2$/Vs. In this case, $v_L/v_S$ was 1.8 times. Since $V_p$ of the amorphous silicon film was 10.5 m/s as in Example 1, the scanning speed coefficient K as the ratio of scanning speed/$V_p$ was 104.8%.

EXAMPLE 8

Polycrystalline semiconductor TFTs were formed in the same manner as in Example 5 by using the same polycrystalline semiconductor thin film as in Example 7. It was found that the TFTs had a high current driving performance depending on the electric field effect mobility. In this Example, designing was so made that the width of the stripe was 40 μm, and the center of the channel was within ±0.25·(the width of the stripe (μm)) with respect to the center of the stripe.

EXAMPLE 9

A TFT substrate was formed in the same manner as in Example 6 by using the same polycrystalline semiconductor film as in Example 7. In this Example, an excellent video picture could be displayed as well. Even in this Example, a circuit network for which further quick switching operations are required could be installed on the same and single substrate.

TABLE 1

| Example | Product | Deposition apparatus | Deposition $T_s$ (°C.) | Thickness d (nm) | de-H $T_s$ (°C.) | Spot size (μm,μm) | HSBA scan speed (m/s) | Laser power (W) | $V_p$ value | Speed ratio (%) | (cm$^2$/V · S) $v_L$ | $v_S$ | $v_L/v_S$ |
|---|---|---|---|---|---|---|---|---|---|---|---|---|---|
| 1 | poly-Si | PECVD | 300 | 120 | 350 | 100/140 | 10.0 | 7.0 | 10.5 | 95.2 | 70 | 20 | 3.5 |
| *2 | poly-Si | ↑ | ↑ | ↑ | ↑ | ↑ | 13.0 | 8.4 | 10.5 | 123.8 | 38 | 38 | 1.0 |
| 3 | poly-Si | LPCVD | 430 | 100 | — | 80/100 | 11.0 | 8.0 | 11.5 | 95.7 | 110 | 35 | 3.1 |
| *4 | poly-Si | ↑ | ↑ | ↑ | ↑ | ↑ | 13.0 | 8.6 | 11.5 | 113.0 | 45 | 45 | 1.0 |
| 5 | poly-Si-TFT employed a poly-Si of example 1 with inter-digital source/drain and spiral gate | | | | | | | | | | | | |
| 6 | LCD panel (XGA size): employed poly-Si-TFTs of example 5 | | | | | | | | | | | | |
| 7 | poly-Si | PECVD | 300 | 120 | 350 | 100/140 | 11.0 | 7.6 | 10.5 | 104.8 | 47 | 26 | 1.8 |
| 8 | TFT: employed a poly-Si of example 7 | | | | | | | | | | | | |
| 9 | LCD panel (XGA size): employed TFTs of example 8 | | | | | | | | | | | | |
| 10 | poly-Si | PECVD | 250 | 130 | 400 | 100/140 | 10.0 | 7.0 | 10.5 | 95.2 | 95 | 24 | 4.0 |

Note: examples 2 and 4 are comparative.
PECVD conditions: SiH$_4$ gas, Reaction pressure 0.30 torr, 32 mW/cm$^2$ RF power
LPCVD conditions: Si$_2$H$_6$ gas, Reaction pressure 250 mtorr, 430° C.
Spot size of laser baem: non-symmetrical shape in XY direction is used (substantially elliptic spot)

TABLE 2

| Example | Product | Deposition apparatus | Deposition $T_s$ (°C.) | Thickness d (nm) | de-H $T_s$ (°C.) | Spot size (μm,μm) | HSBA scan speed (m/s) | Laser power (W) | $V_P$ value | Speed ratio (%) | $v_L$ (cm²/V·S) | $v_S$ | $v_L/v_S$ |
|---|---|---|---|---|---|---|---|---|---|---|---|---|---|
| 11 | poly-Si | PECVD | 250 | 150 | 400 | 100/140 | 11.0 | 7.2 | 10.5 | 104.8 | 70 | 37 | 1.9 |
| 12 | poly-Si | ↑ | 350 | 150 | 350 | ↑ | 11.0 | 7.2 | ↑ | 104.8 | 47 | 26 | 1.8 |
| 13 | poly-Si | ↑ | 300 | 80 | 350 | ↑ | 10.3 | 7.0 | ↑ | 98.1 | 59 | 18 | 3.3 |
| 14 | poly-Si | ↑ | ↑ | 160 | ↑ | ↑ | 10.3 | 6.8 | ↑ | 98.1 | 45 | 10 | 4.5 |
| 15 | Shift-Register: using poly-Si-TFTs employed a poly-Si of example 1: maximum operating Frequency = 6 MHz with inter-digital source/drain and spiral gate | | | | | | | | | | | | | |
| *16 | Shift-Register: using poly-Si-TFTs employed a poly-Si of example 2: maximum operating Frequency = 4 MHz with inter-digital source/drain and spiral gate | | | | | | | | | | | | | |
| 17 | poly-Si | PECVD | 300 | 120 | 350 | 100/140 | 9.0 | 6.2 | 10.5 | 85.7 | 35 | 8 | 4.4 |
| 18 | poly-Si | LPCVD | 430 | 100 | — | 80/100 | 10.0 | 7.6 | 11.5 | 87.0 | 65 | 26 | 2.5 |
| *19 | poly-Si | PECVD | 300 | 120 | 350 | 100/140 | 12.0 | 6.2 | 10.5 | 85.7 | 40 | 40 | 1.0 |
| 20 | poly-Si | PECVD | 200 | 120 | 450 | 100/160 | 10.5 | 11.5 | 10.5 | 100.0 | 125 | 25 | 5.0 |

Note: examples 16 and 19 are comparative.
PECVD conditions: $SiH_4$ gas, Reaction pressure 0.30 torr, 32 mW/cm² RF power
LPCVD conditions: $Si_2H_6$ gas, Reaction pressure 250 mtorr, 430° C.
Spot size of laser beam: non-symmetrical shape in XY direction is used (substantially elliptic spot)

EXAMPLES 10 through 20

Table 1 and 2 show manufacturing conditions and element structures of each of Examples 10 through 20 together with those of the above-mentioned Examples 1 through 9. Specifically, it shows data of film forming device, film forming temperature, film thickness, process temperature at dehydrogenation, beam spot size (size in a scanning direction, size in a widthwise direction), scanning speed, laser power, $V_p$, speed coefficient, electric field effect mobility $v_L$ in a stripe direction, electric field effect mobility $v_S$ in a direction perpendicular to the stripe direction and ratio of one electric field effect mobility to the other.

In this application, a polycrystalline silicon film of high performance was formed by HSBA method, and a polycrystalline silicon TFT using the film was obtained. Further, a polycrystalline silicon TFT wherein the source-drain structure of TFT is arranged in a comb-teeth like form or an inter-digital form, the gate is in a spiral form and a polycrystalline silicon TFT having a high electric current driving performance were employed for a circuit element in each block of peripheral driving circuits of a liquid crystal display element, and performance was evaluated. Further, a case of XGA was considered for the density of picture of the liquid crystal display element. In Example 15, for instance, a polycrystalline semiconductor TFT was formed by using the polycrystalline semiconductor thin film of Example 1, and a shift register was formed. Since the TFT had a high current driving performance in response to the electric field effect mobility, the operating frequency was improved in comparison with the conventional technique. In forming the polycrystalline TFT of the present invention, designing was so made that the center of a TFT channel was arranged within ±0.25·(the width of the stripe (μm)) with respect to the center of the stripe.

In the above-mentioned measurements on the electric field effect mobility for p-channel TFTs other than n-channel TFTs, the same tendency as in the n-channel TFTs was obtained. Measurement of the electric field effect mobility was conducted with TFT having less influence on an off-set gate structure i.e. with a large channel length ($L_{CH}$=25 μm).

In the present invention, a continuous wave argon ion laser is used as a light source for energy beam. However, another continuous wave laser beam such as a blue color or a green color may be used. Further, even when other energy beams such as a continuous oscillation laser or electron beams are employed, it is believed that the same relation and the same way of thinking can be applied. Further, the present invention can be applied to various kinds of TFTs such as a reverse stagger type, a forward stagger type or a coplanner type. The present invention is applicable not only to a display element, but also to another electronic element using a TFT.

According to the present invention, a TFT of higher performance could be obtained by finding the optimum manufacturing conditions capable of further improving the quality of a polycrystalline semiconductor thin film in HSBA method. Namely, polycrystallization of an amorphous semiconductor thin film was conducted by determining the optimum scanning speed, and the physical properties of a polycrystalline semiconductor thin film and a pattern arrangement of TFTs were combined whereby a further improved TFT substrate and an active matrix display element could be manufactured in comparison with those by the conventional technique.

The present invention permitted a one-piece accumulation of a non-monolithic type TFT substrate wherein polycrystalline semiconductor TFTs were formed on a glass substrate, together with a pixel region and a peripheral driving circuit for which a quick operation and large current driving were required. Further, a TFT for driving a pixel afforded an operating margin, and an optical performance in total as a display element, e.g., the numerical aperture could be improved in the specifications of a predetermined pixel size and a driving TFT.

In the present invention, a stripe of polycrystalline semiconductor thin film which exhibits anisotropy in the electric field effect mobility could be obtained. It was usable for an element for an electronic device.

Further, according to the present invention, a polycrystalline semiconductor thin film capable of high speed switching could be obtained owing to the electric field effect mobility. For example, even in a case of employing a block sequence driving system, a TFT substrate capable of displaying a video picture could be formed even when an addressing time to a picture driving TFT was short. Namely, even when an off-set gate structure was used for the picture driving TFT so that a certain degree of electric insulating properties was provided from the relation of a holding factor and a driving voltage, an excellent display could be obtained by the polycrystalline semiconductor TFT of the present invention using the film of high electric field effect mobility.

The polycrystalline semiconductor TFT of the present invention could be used for a circuit system such as a low driver circuit or a column driver circuit for which the most severe operating conditions are required.

The polycrystalline semiconductor thin film of high quality and reliability could continuously be supplied at a high productivity.

Further, according to the present invention, the polycrystalline semiconductor thin film of further uniform characteristics could be obtained.

In the present invention, the TFT substrate wherein elements were integrally accumulated on the same insulating substrate could be obtained. Further, the manufacturing cost of the entire system could be reduced and miniaturization of the device could be achieved.

Further, for instance, in Example 1 or 2 of the present invention, a performance of mobility factor of polysilicon-Si-TFT is so improved from 40 to about 70 cm$^2$/Vs that "a charging time" for a pixel of 100 μm×300 μm size is reduced from 0.3 μs to 0.2 μs.

Further, a maximum operating frequency of shift register employing such a polysilicon-Si-TFT progresses to be 6 MHz, compared with a prior art having a 4 MHz operation.

As a result, under conditions such as pixels layouted with 300 μm pitch and maximum input signal lines are less than or equal to 40 lines, an improvement of panel size from 11.8 size SVGA to 15.1 size XGA was realized in a LCD-panel integrated with gate (row) and data (column) driver circuit on a same substrate.

Further, in the present invention, the polycrystalline semiconductor TFT of high performance could be stably manufactured by using HSBA method as an effective method, and accordingly, reliability was improved. In particular, it could be applied to a small or medium sized TFT-LCD. Further, a display element for a large-sized, high dense work station could be manufactured.

The various applications are possible in the present invention as far as the advantage is not reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A polycrystalline semiconductor thin film formed in a stripe shape on an insulating substrate wherein an electric field effect mobility $v_L$ in a longitudinal direction of a stripe is different from an electric field effect mobility $v_S$ in a width direction of the stripe, and $v_L \geq 1.5 \cdot v_S$ is satisfied.

2. A polycrystalline semiconductor thin film according to claim 1, wherein the electric field effect mobility $v_L$ is 55 cm$^2$/V$_S$ or more.

3. A polycrystalline semiconductor thin film according to claim 2, wherein the electric field effect mobility $v_L$ is 200 cm$^2$/V$_S$ or less.

4. A polycrystalline semiconductor thin film according to claim 3, wherein polycrystalline particles are arranged in a line-texture form with respect to a scanning direction of the stripe.

5. A polycrystalline semiconductor thin film according to claim 4, wherein the thin film is obtained by annealing an amorphous silicon semiconductor of a film thickness of 50 nm–150 nm containing silicon as the main component.

6. A polycrystalline semiconductor thin film according to claim 5, wherein hydrogen content is about 1 atm % or more.

7. A polycrystalline semiconductor thin film according to claim 4, wherein hydrogen content is about 1 atm % or more.

8. A polycrystalline semiconductor thin film according to claim 2, wherein polycrystalline particles are arranged in a line-texture form with respect to a scanning direction of the stripe.

9. A polycrystalline semiconductor thin film according to claim 8, wherein the thin film is obtained by annealing an amorphous silicon semiconductor of a film thickness of 50 nm–150 nm containing silicon as the main component.

10. A polycrystalline semiconductor thin film according to claim 9, wherein hydrogen content is about 1 atm % or more.

11. A polycrystalline semiconductor thin film according to claim 8, wherein hydrogen content is about 1 atm % or more.

12. A polycrystalline semiconductor thin film according to claim 2, wherein the thin film is obtained by annealing an amorphous silicon semiconductor of a film thickness of 50 nm–150 nm containing silicon as the main component.

13. A polycrystalline semiconductor thin film according to claim 12, wherein hydrogen content is about 1 atm % or more.

14. A polycrystalline semiconductor thin film according to claim 3, wherein the thin film is obtained by annealing an amorphous silicon semiconductor of a film thickness of 50 nm–150 nm containing silicon as the main component.

15. A polycrystalline semiconductor thin film according to claim 14, wherein hydrogen content is about 1 atm % or more.

16. A polycrystalline semiconductor thin film according to claim 3, wherein hydrogen content is about 1 atm % or more.

17. A polycrystalline semiconductor thin film according to claim 2, wherein hydrogen content is about 1 atm % or more.

18. A polycrystalline semiconductor thin film according to claim 1, wherein polycrystalline particles are arranged in a line-texture form with respect to a scanning direction of the stripe.

19. A polycrystalline semiconductor thin film according to claim 18, wherein the thin film is obtained by annealing an amorphous silicon semiconductor of a film thickness of 50 nm–150 nm containing silicon as the main component.

20. A polycrystalline semiconductor thin film according to claim 19, wherein hydrogen content is about 1 atm % or more.

21. A polycrystalline semiconductor thin film according to claim 18, wherein hydrogen content is about 1 atm % or more.

22. A polycrystalline semiconductor thin film according to claim 1, wherein the thin film is obtained by annealing an amorphous silicon semiconductor of a film thickness of 50 nm–150 nm containing silicon as the main component.

23. A polycrystalline semiconductor thin film according to claim 22, wherein hydrogen content is about 1 atm % or more.

24. A polycrystalline semiconductor thin film according to claim 1, wherein hydrogen content is about 1 atm % or more.

25. A polycrystalline semiconductor TFT which comprises the polycrystalline semiconductor thin film according to claim 1, wherein the thin film is used for a channel of the polycrystalline semiconductor TFT, and the longitudinal direction of a stripe is substantially in parallel to the direction of the channel.

26. A polycrystalline semiconductor TFT according to claim 25, wherein a source electrode and a drain electrode of the polycrystalline semiconductor TFT are formed in a comb-teeth form.

27. A TFT substrate which comprises pixels formed in a matrix from, driving elements provided in respective pixels to drive them, a row driver circuit for supplying a row signal to a row electrode connected to a driving element, and a column driver circuit for supplying a column signal to a column electrode connected to a driving element, wherein the polycrystalline semiconductor TFT according to claim 25 is used for a part of the row driver circuit and/or a part of the column driver circuit.

28. A TFT substrate wherein the polycrystalline semiconductor TFT according to claim 25 is used for at least one selected from the group consisting of s shift register in a row driver circuit, a correction circuit in the row driver circuit, a current amplifying buffer in the row driver circuit, and an output buffer in a column driver circuit.

* * * * *

UNITED STATES PATENT AND TRADEMARK OFFICE
CERTIFICATE OF CORRECTION

PATENT NO. : 5,808,318
DATED : September 15, 1998
INVENTOR(S) : Kunio MASUMO et al.

It is certified that error appears in the above-identified patent and that said Letters Patent is hereby corrected as shown below:

On the Title page, Item [30], the Foreign Application Priority Data information is incorrect. It should be:

--Mar. 29, 1996  [JP]  Japan.........8-77072
  Apr.  5, 1996  [JP]  Japan.........8-84290
  Apr.  8, 1996  [JP]  Japan.........8-85472--

Signed and Sealed this

Eighteenth Day of May, 1999

Attest:

Q. TODD DICKINSON

Attesting Officer

Acting Commissioner of Patents and Trademarks